(12) United States Patent  
Yu

(10) Patent No.: US 6,365,445 B1  
(45) Date of Patent: Apr. 2, 2002

(54) FIELD EFFECT TRANSISTOR FORMED IN SOI TECHNOLOGY WITH SEMICONDUCTOR MATERIAL HAVING MULTIPLE THICKNESSES

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/846,957

(22) Filed: May 1, 2001

(51) Int. Cl.$^7$ ................................................ H01L 21/84
(52) U.S. Cl. ...................... 438/149; 438/151; 438/163; 438/164; 257/347; 257/353
(58) Field of Search .................. 438/149, 150, 438/151, 163, 164, 166, 592, 595; 257/347, 352, 353

(56) References Cited

U.S. PATENT DOCUMENTS

| | | | | |
|---|---|---|---|---|
| 5,567,966 A | * | 10/1996 | Hwang | 257/347 |
| 5,751,631 A | * | 5/1998 | Liu et al. | 257/316 |
| 5,869,359 A | * | 2/1999 | Prabhakar | 438/149 |
| 6,054,386 A | * | 4/2000 | Prabhakar | 438/149 |
| 6,060,749 A | * | 5/2000 | Wu | 257/347 |
| 6,064,092 A | * | 5/2000 | Park | 257/330 |
| 6,326,291 B1 | * | 12/2001 | Yu | 438/592 |

* cited by examiner

Primary Examiner—Kevin M. Picardat

(74) Attorney, Agent, or Firm—Monica H. Choi

(57) ABSTRACT

For fabricating a field effect transistor on a buried insulating material in SOI (semiconductor on insulator) technology, a dielectric island is formed on the buried insulating material. An opening is etched through the buried insulating material at a location away from the dielectric island. An amorphous semiconductor material is deposited to fill the opening through the buried insulating material and to surround the dielectric island. The amorphous semiconductor material is polished until the top surface of the dielectric island is exposed and such that the amorphous semiconductor material surrounds the dielectric island. A layer of the amorphous semiconductor material is deposited on top of the dielectric island and on top of the amorphous semiconductor material surrounding the dielectric island. The amorphous semiconductor material surrounding the dielectric island and the layer of the amorphous semiconductor material are recrystallized to form a substantially single crystal structure of semiconductor material. A gate dielectric and a gate electrode of the field effect transistor are formed on top of a thinner portion of the semiconductor material disposed on the dielectric island. A drain extension region and a source extension region are formed by implanting a drain and source dopant into exposed regions of the thinner portion of the semiconductor material disposed on the dielectric island to minimize short channel effects. A drain contact region and a source contact region are formed from a thicker portion of the semiconductor material disposed to the sides of the dielectric island. The drain and source silicides are formed with the thicker drain and source contact regions to minimize parasitic resistance at the drain and source.

18 Claims, 5 Drawing Sheets

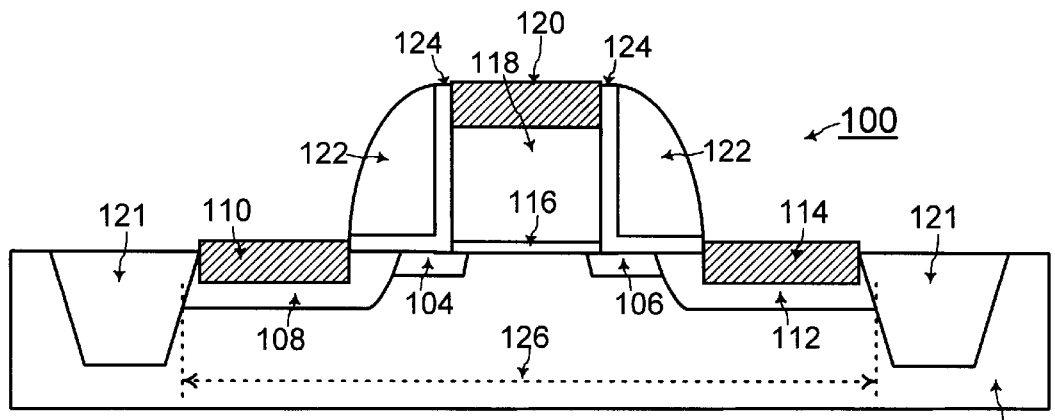
FIG. 1 *(Prior Art)*
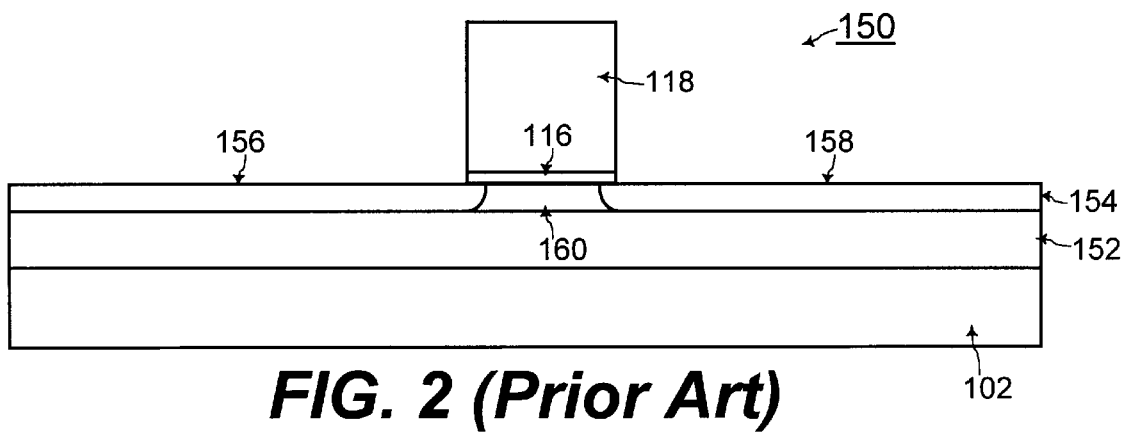
FIG. 2 *(Prior Art)*
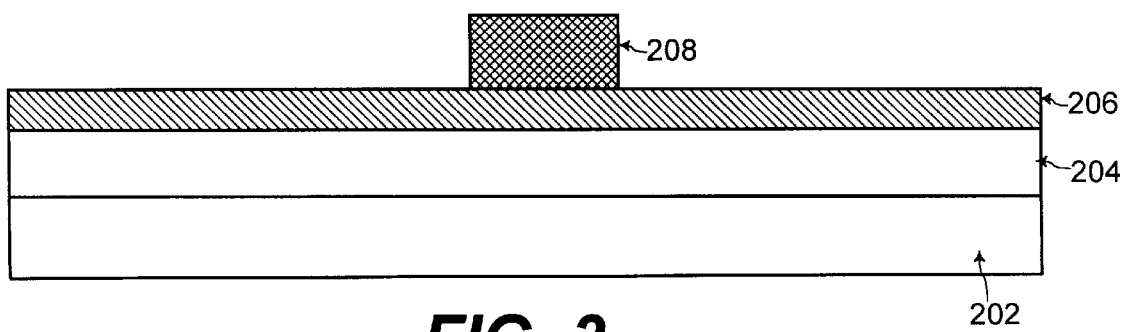
FIG. 3

US 6,365,445 B1

FIELD EFFECT TRANSISTOR FORMED IN SOI TECHNOLOGY WITH SEMICONDUCTOR MATERIAL HAVING MULTIPLE THICKNESSES

TECHNICAL FIELD

The present invention relates generally to fabrication of field effect transistors having scaled-down dimensions, and more particularly, to fabrication of a field effect transistor using a semiconductor material having multiple thicknesses in SOI (semiconductor on insulator) technology, for minimizing short-channel effects in the field effect transistor and for minimizing series resistance at the drain and source.

BACKGROUND OF THE INVENTION

Referring to FIG. 1, a common component of a monolithic IC is a MOSFET (Metal Oxide Semiconductor Field Effect Transistor) 100 which is fabricated within a semiconductor substrate 102. The scaled down MOSFET 100 having submicron or nanometer dimensions includes a drain extension junction 104 and a source extension junction 106 formed within an active device area 126 of the semiconductor substrate 102. The drain extension junction 104 and the source extension junction 106 are shallow junctions to minimize short-channel effects in the MOSFET 100 having submicron or nanometer dimensions, as known to one of ordinary skill in the art of integrated circuit fabrication.

The MOSFET 100 further includes a drain contact junction 108 with a drain silicide 110 for providing contact to the drain of the MOSFET 100 and includes a source contact junction 112 with a source silicide 114 for providing contact to the source of the MOSFET 100. The drain contact junction 108 and the source contact junction 112 are fabricated as deeper junctions such that a relatively large size of the drain silicide 110 and the source silicide 114 respectively may be fabricated therein to provide low resistance contact to the drain and the source respectively of the MOSFET 100.

The MOSFET 100 further includes a gate dielectric 116 and a gate electrode 118 which may be comprised of polysilicon. A gate silicide 120 is formed on the polysilicon gate electrode 118 for providing contact to the gate of the MOSFET 100. The MOSFET 100 is electrically isolated from other integrated circuit devices within the semiconductor substrate 102 by shallow trench isolation structures 121. The shallow trench isolation structures 121 define the active device area 126, within the semiconductor substrate 102, where a MOSFET is fabricated therein.

The MOSFET 100 also includes a spacer 122 disposed on the sidewalls of the gate electrode 118 and the gate dielectric 116. When the spacer 122 is comprised of silicon nitride ($Si_3N_4$), then a spacer liner oxide 124 is deposited as a buffer layer between the spacer 122 and the sidewalls of the gate electrode 118 and the gate dielectric 116.

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

As the dimensions of the MOSFET 100 are scaled down further, the junction capacitances formed by the drain and source extension junctions 104 and 106 and by the drain and source contact junctions 108 and 112 may limit the speed performance of the MOSFET 100. Thus, referring to FIG. 2, a MOSFET 150 is formed with SOI (semiconductor on insulator) technology. In that case, a layer of buried insulating material 152 is formed on the semiconductor substrate 102, and a layer of semiconductor material 154 is formed on the layer of buried insulating material 152. A drain region 156 and a source region 158 of the MOSFET 150 are formed in the layer of semiconductor material 154. Elements such as the gate dielectric 116 and the gate electrode 118 having the same reference number in FIGS. 1 and 2 refer to elements having similar structure and function. Processes for formation of such elements 116, 118, 152, 154, 156, and 158 of the MOSFET 150 are known to one of ordinary skill in the art of integrated circuit fabrication.

In FIG. 2, the drain region 156 and the source region 158 are formed to extend down to contact the layer of buried insulating material 152. Thus, because the drain region 156, the source region 158, and a channel region 160 of the MOSFET 150 do not form a junction with the semiconductor substrate 102, junction capacitance is minimized for the MOSFET 150 to enhance the speed performance of the MOSFET 150 formed with SOI (semiconductor on insulator) technology, as known to one of ordinary skill in the art of integrated circuit fabrication.

The layer of semiconductor material 154 on the buried insulating material 152 is formed to be relatively thin (having a thickness of about 50 angstroms to about 500 angstroms for example) such that the channel region 160 between the drain and source regions 156 and 158 is filly depleted during operation of the MOSFET 150. Operation of the MOSFET 150 formed in SOI (semiconductor on insulator) technology with the fully depleted channel region 160 to minimize undesired short channel effects is known to one of ordinary skill in the art of integrated circuit fabrication.

However, because the layer of semiconductor material 154 is formed to be relatively thin for the fully depleted channel region 160 of the MOSFET 150, the drain and source silicides formed with the drain and source regions 156 and 158 are confined to be relatively thin. Relatively thin drain and source silicides disadvantageously result in higher parasitic resistance at the drain and source of the MOSFET 150 to degrade the speed performance of the MOSFET 150. Nevertheless, a relatively thin layer of semiconductor material 154 is used for the fully depleted channel region 160 to minimize undesired short channel effects of the MOSFET 150.

Thus, a mechanism is desired for using a relatively thin semiconductor material to form the drain and source regions and the channel region of the field effect transistor to minimize undesired short channel effects while forming drain and source silicides with a thicker semiconductor material to minimize parasitic resistance at the drain and source.

SUMMARY OF THE INVENTION

Accordingly, in a general aspect of the present invention, a field effect transistor is fabricated by forming a semiconductor material having portions with multiple thicknesses in SOI (semiconductor on insulator) technology, to form drain and source extension junctions on a thinner portion of the semiconductor material and to form drain and source silicides on a thicker portion of the semiconductor material.

In one embodiment of the present invention, in a method for fabricating a field effect transistor on a buried insulating material in SOI (semiconductor on insulator) technology, a layer of dielectric material is deposited on the buried insulating material. The layer of dielectric material is patterned to form a dielectric island having a top surface and having a height of a thickness of the layer of dielectric material. An opening is etched through the buried insulating material at a location away from the dielectric island. An amorphous semiconductor material is deposited to fill the opening through the buried insulating material and to surround the dielectric island. The amorphous semiconductor material is polished until the top surface of the dielectric island is exposed and such that the amorphous semiconductor material surrounds the dielectric island.

A layer of the amorphous semiconductor material is deposited on top of the dielectric island and on top of the amorphous semiconductor material surrounding the dielectric island. The amorphous semiconductor material surrounding the dielectric island and the layer of the amorphous semiconductor material are recrystallized to form a substantially single crystal structure of semiconductor material. The semiconductor material disposed on the dielectric island has a thickness that is less than that of the semiconductor material that extends above the height of the dielectric island to the sides of the dielectric island.

A gate dielectric and a gate electrode of the field effect transistor are formed on top of a thinner portion of the semiconductor material disposed on the dielectric island. A drain extension region and a source extension region are formed by implanting a drain and source dopant into exposed regions of the thinner portion of the semiconductor material disposed on the dielectric island. A channel region of the field effect transistor is formed by the thicker portion of the semiconductor material disposed on the dielectric island between the drain and source extension regions. A drain contact region and a source contact region are formed from the thicker portion of the semiconductor material disposed to the sides of the dielectric island. The drain and source silicides are formed with the drain and source contact regions, respectively.

The present invention may be used to particular advantage when the dielectric island is comprised of silicon nitride ($Si_3N_4$) and when the amorphous semiconductor material is comprised of amorphous silicon.

In this manner, the drain and source extension junctions are formed on the thinner portion of the semiconductor material disposed on the dielectric island to minimize short channel effects of the field effect transistor and such that the channel region of the field effect transistor is fully depleted. In addition, the drain and source silicides are formed with the thicker portion of the semiconductor material disposed to the sides of the dielectric island. With thicker drain and source silicides, parasitic resistance at the drain and source of the field effect transistor is minimized to enhance speed performance of the field effect transistor.

These and other features and advantages of the present invention will be better understood by considering the following detailed description of the invention which is presented with the attached drawings.

BRIEF DESCRIPTION OF THE DRAWINGS

FIG. 1 shows a cross-sectional view of a conventional MOSFET (Metal Oxide Semiconductor Field Effect Transistor) fabricated within a bulk semiconductor substrate, according to the prior art;

FIG. 2 shows a cross-sectional view of a MOSFET (Metal Oxide Semiconductor Field Effect Transistor) fabricated using a thin semiconductor layer having a uniform thickness in SOI (semiconductor on insulator) technology, according to the prior art; and FIGS. 3, 4, 5, 6, 7, 8, 9, 10, 11, 12, 13, 14, 15, and 16 show cross-sectional views for illustrating the steps for fabricating a field effect transistor from semiconductor material having multiple thicknesses in SOI (semiconductor on insulator) technology, to minimize undesired short channel effects and parasitic resistance from the drain and source silicides, according to an embodiment of the present invention.

The figures referred to herein are drawn for clarity of illustration and are not necessarily drawn to scale. Elements having the same reference number in FIGS. 1, 2, 3, 4, 5, 6, 7, 8, 9, 10, 11, 12, 13, 14, 15, and 16 refer to elements having similar structure and function.

DETAILED DESCRIPTION

Figure 4:
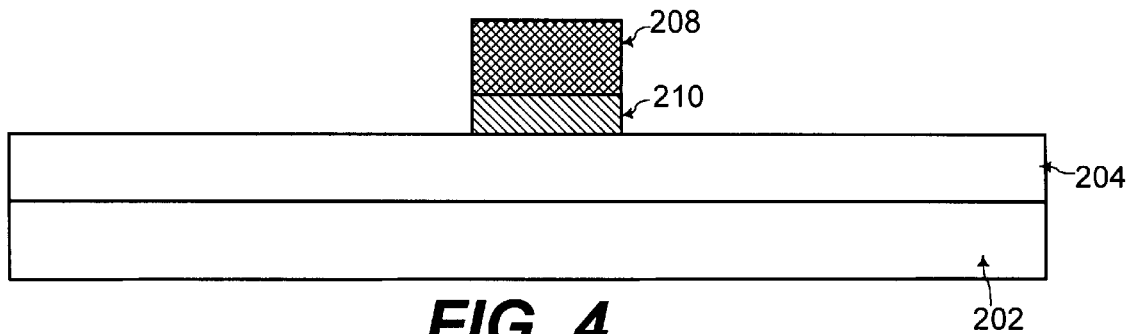

In the cross-sectional view of FIG. 3, for fabricating a MOSFET (Metal Oxide Semiconductor Field Effect Transistor) in SOI (semiconductor on insulator) technology, a layer of buried insulating material 204 is deposited on a semiconductor substrate 202. In one embodiment of the present invention, the semiconductor substrate is comprised of silicon, and the layer of buried insulating material 204 is comprised of silicon dioxide ($SiO_2$) having a thickness in a range of from about 800 angstroms to about 3,000 angstroms. Processes for deposition of the layer of buried insulating material 204 on the semiconductor substrate 202 are known to one of ordinary skill in the art of integrated circuit fabrication.

Further referring to FIG. 3, a layer of dielectric material 206 is deposited on the layer of buried insulating material 204. In one embodiment of the present invention, the layer of dielectric material 206 is comprised of silicon nitride ($Si_3N_4$) having a thickness in a range of from about 300 angstroms to about 500 angstroms. Processes for deposition of the layer of dielectric material 206 on the layer of buried insulating material 204 are known to one of ordinary skill in the art of integrated circuit fabrication. In addition, referring to FIG. 3, a masking structure 208 is formed on the layer of dielectric material 206. The masking structures 208 is comprised of photoresist material according to one embodiment of the present invention. Processes for patterning photoresist material to form the masking structure 208 are known to one of ordinary skill in the art of integrated circuit fabrication.

Referring to FIG. 4, any exposed region of the layer of dielectric material 206 not under the masking structure 208 is etched away to form a dielectric island 210. The dielectric island 210 is comprised of the dielectric material 206 remaining under the masking structure 208. Processes for etching away the exposed region of the layer of dielectric material 206 which is comprised of silicon nitride ($Si_3N_4$) for example are known to one of ordinary skill in the art of integrated circuit fabrication.

Figure 5:
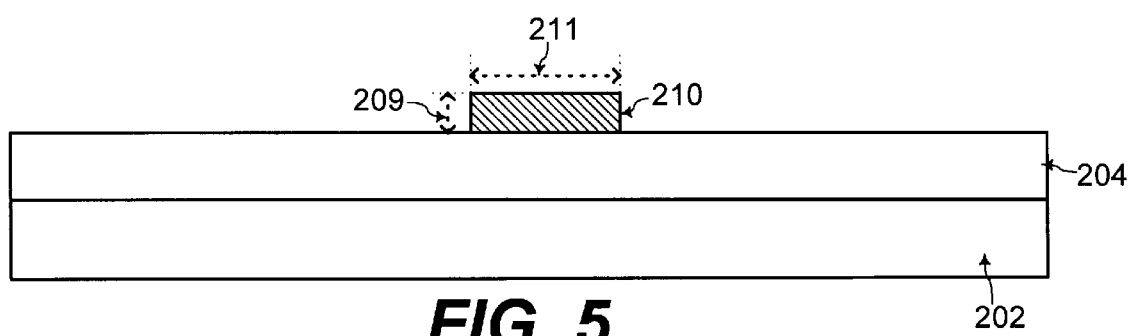

Referring to FIG. 5, the masking structure 208 is etched away from a top surface of the dielectric island 210. The dielectric island 210 has a width 211 in a range of from about 100 angstroms to about 300 angstroms according to one embodiment of the present invention. In addition, the dielectric island 210 has a height 209 that is substantially the thickness of the layer of dielectric material 210 in a range of from about 300 angstroms to about 500 angstroms according to one embodiment of the present invention. Processes for etching away the masking structure 208 which is comprised of photoresist material for example are known to one of ordinary skill in the art of integrated circuit fabrication.

Figure 6:
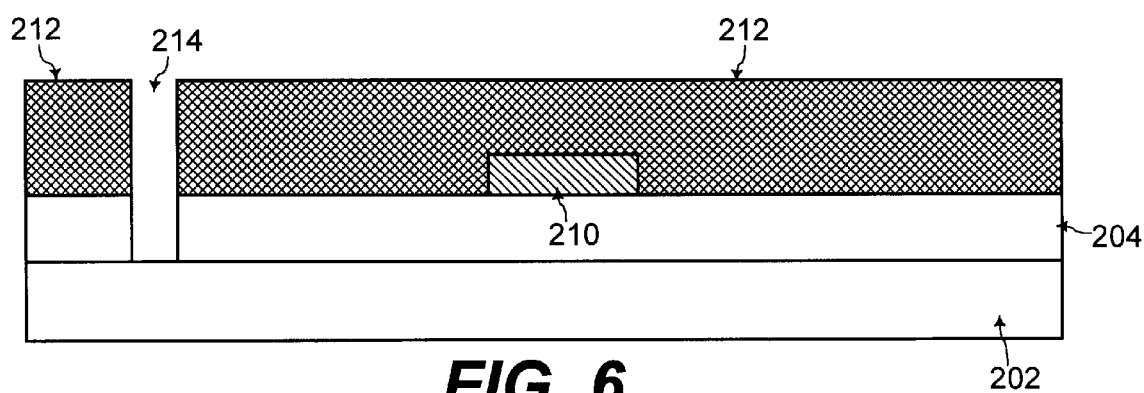

Referring to FIG. 6, a masking material 212 such as photoresist material for example is patterned to form an opening 214 through the buried insulating material 204. The opening 214 is disposed away from the dielectric island 210. Processes for patterning the masking material 212 such as photoresist material for example and for etching the opening 214 through the buried insulating material 204 are known to one of ordinary skill in the art of integrated circuit fabrication.

Figure 7:
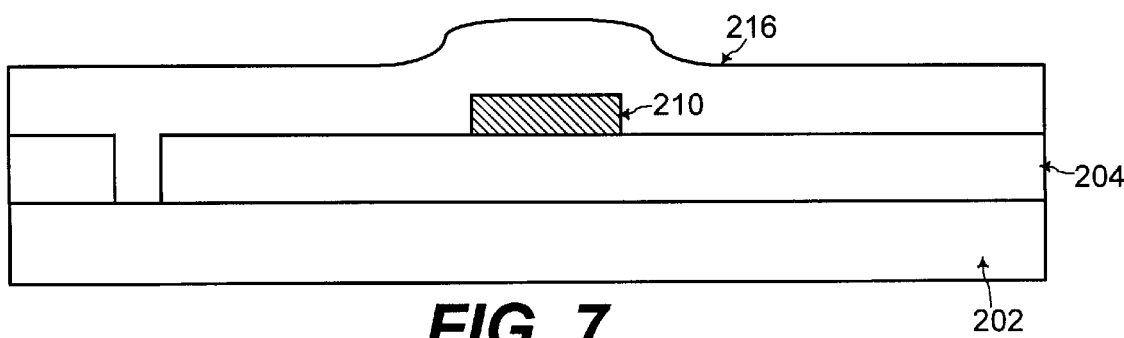

Referring to FIG. 7, the masking material 212 is etched away. Processes for etching away the masking material 212 which is comprised of photoresist material for example are known to one of ordinary skill in the art of integrated circuit fabrication. Further referring to FIG. 7, an amorphous semiconductor material 216 is conformally deposited to fill the opening 214 and to surround the dielectric island 210. The amorphous semiconductor material 216 is comprised of amorphous silicon having a thickness in a range of from about 1,000 angstroms to about 2,000 angstroms deposited in a LPCVD (low pressure chemical vapor deposition) process using a temperature of less than about 550° Celsius, according to one embodiment of the present invention. Such a low temperature ensures that the amorphous silicon 216 does not recrystallize. Processes, such as LPCVD (low pressure chemical vapor deposition) processes for depositing the amorphous silicon 216 are known to one of ordinary skill in the art of integrated circuit fabrication.

Figure 8:
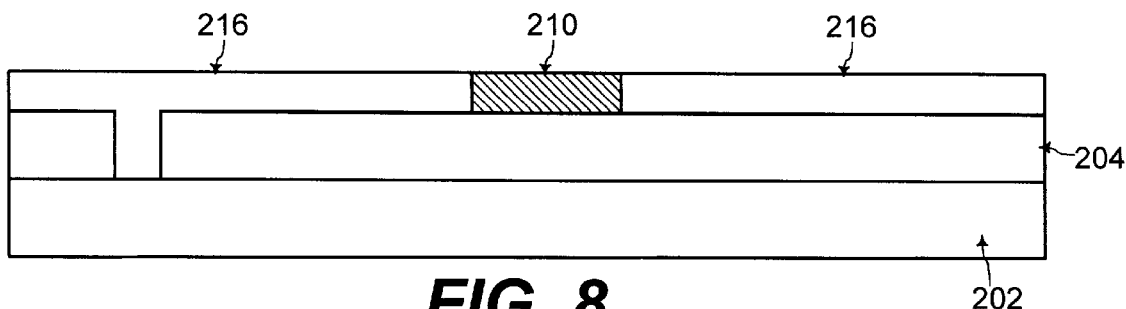

Referring to FIG. 8, the amorphous silicon 216 is polished down until the top surface of the dielectric island 210 is exposed. The amorphous silicon 216 surrounds the dielectric island 210 at the sidewalls of the dielectric island 210. Processes, such as CMP (chemical mechanical polishing) processes for polishing down the amorphous silicon 216 are known to one of ordinary skill in the art of integrated circuit fabrication. The dielectric island 210 comprised of silicon nitride (Si3N4) acts as a polish-stop in such a CMP (chemical mechanical polishing) process.

Figure 9:
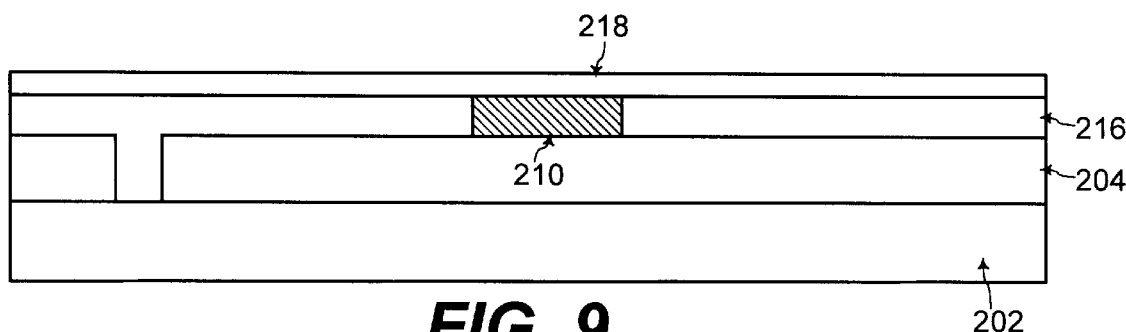

Referring to FIG. 9, a layer of amorphous semiconductor material 218 is deposited on the top surface of the dielectric island 210 and on the amorphous semiconductor material 216 surrounding the sidewalls of the dielectric island 210. The layer of amorphous semiconductor material 218 is comprised of amorphous silicon having a thickness in a range of from about 50 angstroms to about 500 angstroms deposited in a LPCVD (low pressure chemical vapor deposition) process using a temperature of less than about 550° Celsius, according to one embodiment of the present invention. Such a low temperature ensures that the semiconductor material 216 surrounding the dielectric island 210 and the layer of amorphous silicon 218 do not recrystallize. Processes, such as LPCVD (low pressure chemical vapor deposition) processes for depositing the layer of amorphous silicon 218 are known to one of ordinary skill in the art of integrated circuit fabrication.

Figure 10:
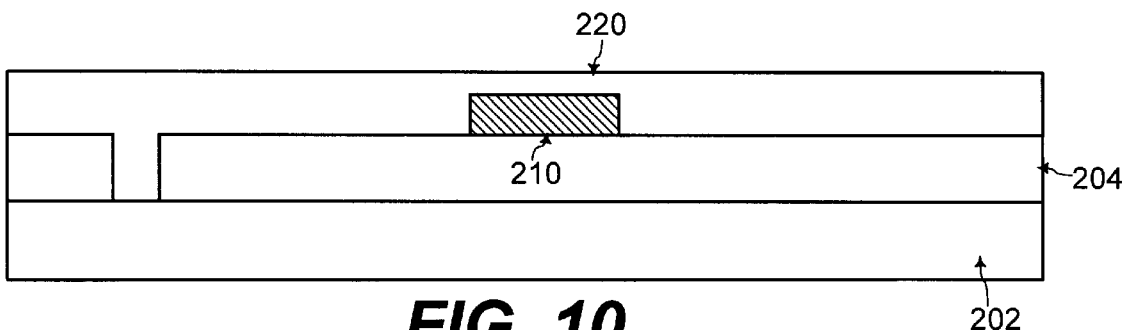

Referring to FIG. 10, a thermal anneal is performed at a temperature in a range of from about 600° Celsius to about 650° Celsius to recrystallize the amorphous silicon 216 surrounding the dielectric island 210 and the layer of amorphous silicon 218 into substantially a single grain crystal structure of semiconductor material 220. The silicon substrate 202 at the bottom wall of the opening 214 acts as a seed during the recrystallization of the amorphous silicon 216 surrounding the dielectric island 210 and the layer of amorphous silicon 218 into substantially the single grain crystal structure of silicon. Thermal anneal processes are known to one of ordinary skill in the art of integrated circuit fabrication.

The semiconductor material 220 on the dielectric island 210 has a lower thickness than the semiconductor material 220 to the sides of the dielectric island 210. The thinner portion of the semiconductor material 220 on the dielectric island 210 has substantially the thickness of the layer of amorphous semiconductor material 218 (in a range of from about 50 angstroms to about 500 angstroms) deposited in FIG. 9. A thicker portion of the semiconductor material 220 to the sides of the dielectric island 210 extends up above the height 209 of the dielectric island 210 and has a thickness of the silicon 216 surrounding the sidewalls of the dielectric island 210 in FIG. 8 and of the layer of amorphous semiconductor material 218 in FIG. 9.

Figure 11:
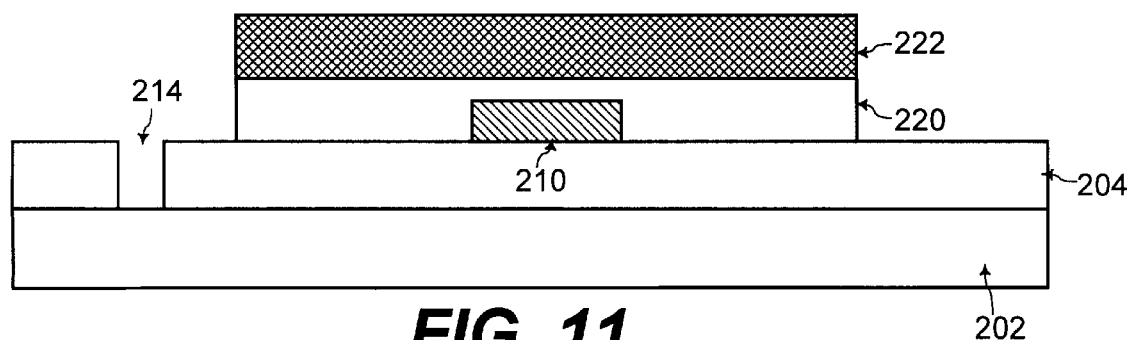

Referring to FIG. 11, a masking structure 222 comprised of photoresist material for example is formed to pattern the semiconductor material 220 such that the semiconductor material 220 filling the opening 214 is etched away. Processes for patterning the masking structure 222 comprised of photoresist material for example and for etching away the semiconductor material 220 filling the opening 214 are known to one of ordinary skill in the art of integrated circuit fabrication.

Figure 12:
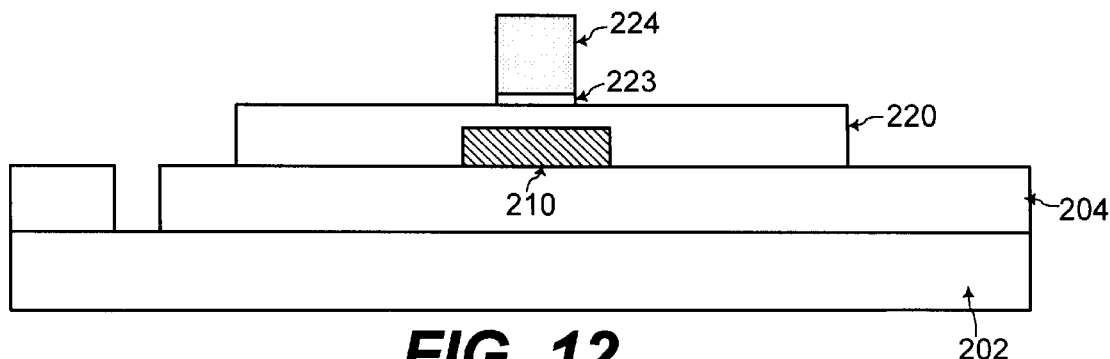

Referring to FIG. 12, a gate dielectric 223 is formed on the thinner portion of the semiconductor material 220 disposed on the dielectric island 210. The gate dielectric 223 is comprised of a dielectric material such as metal oxide for example having a dielectric constant that is higher than that of silicon dioxide ($SiO_2$). When the gate dielectric 223 has a dielectric constant that is higher than the dielectric constant of silicon dioxide ($SiO_2$), the gate dielectric 223 has a higher thickness than if the gate dielectric 223 were comprised of silicon dioxide ($SiO_2$), to minimize undesired tunneling current through the gate dielectric 223. Processes for forming such a gate dielectric 223 are known to one of ordinary skill in the art of integrated circuit fabrication.

Further referring to FIG. 12, a gate electrode 224 is formed on the gate dielectric 223. The gate electrode 224 is comprised of polysilicon according to one embodiment of the present invention. Processes for forming such a gate electrode 224 on the gate dielectric 223 are known to one of ordinary skill in the art of integrated circuit fabrication. Referring to FIG. 12, the gate dielectric 223 and the gate electrode 224 are formed on the thinner portion of the semiconductor material 223 disposed on the dielectric island 210, and the gate dielectric 223 and the gate electrode 224 are centered about the dielectric island 210. Portions of the thinner semiconductor material 223 disposed on the dielectric island 210 are exposed to the sides of the gate electrode 224.

Figure 13:
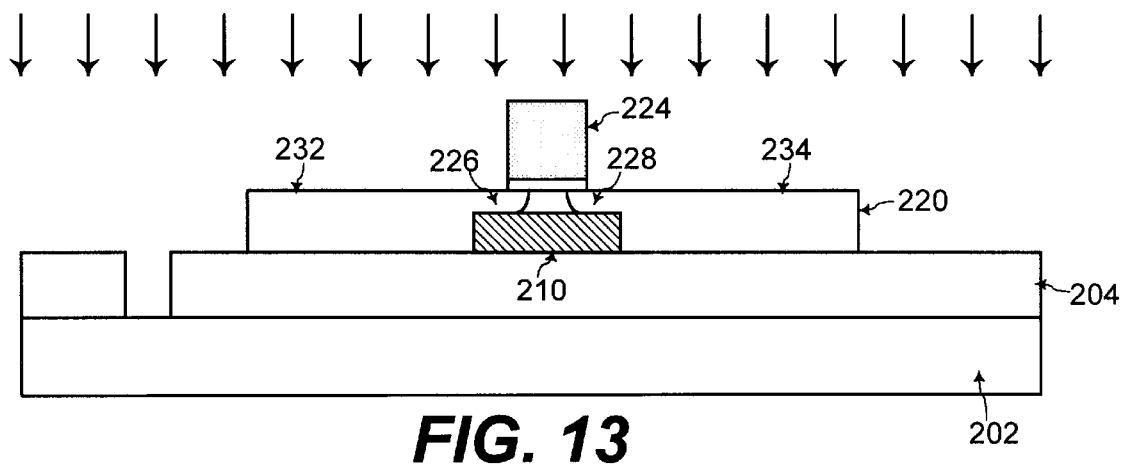

Referring to FIG. 13, a drain and source dopant is implanted into exposed regions of the semiconductor material 220. The drain and source dopant is an N-type dopant such as phosphorous or arsenic for example for fabrication of an NMOSFET (N-channel Metal Oxide Semiconductor Field Effect Transistor). Alternatively, the drain and source dopant is a P-type dopant such as boron for example for fabrication of a PMOSFET (P-channel Metal Oxide Semiconductor Field Effect Transistor). Processes for implantation of such a drain and source dopant are known to one of ordinary skill in the art of integrated circuit fabrication.

Figure 14:
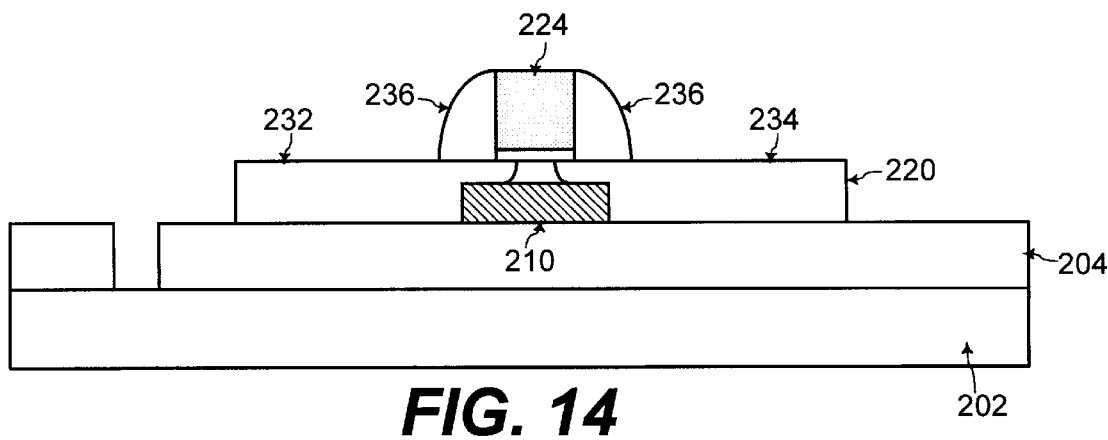

Further referring to FIG. 13, a drain extension region 226 and a source extension region 228 are formed with the drain and source dopant doping the portions of the thinner semiconductor material 220 disposed on the dielectric island 210. A drain contact region 232 and a source contact region 234 are formed with the drain and source dopant doping thicker portions of the semiconductor material 220 to the sides of the dielectric island 210. The channel region of the MOS- FET is formed by the thinner semiconductor material 220 disposed on the semiconductor island 210 between the drain and source extension regions 226 and 228. Referring to FIG. 14, spacers 236 are formed on the sidewalls of the gate dielectric 223 and the gate electrode 224. The spacers 236 are comprised of silicon dioxide (SiO2) according to one embodiment of the present invention, and processes for formation of such spacers 236 are known to one of ordinary skill in the art of integrated circuit fabrication.

Figure 15:
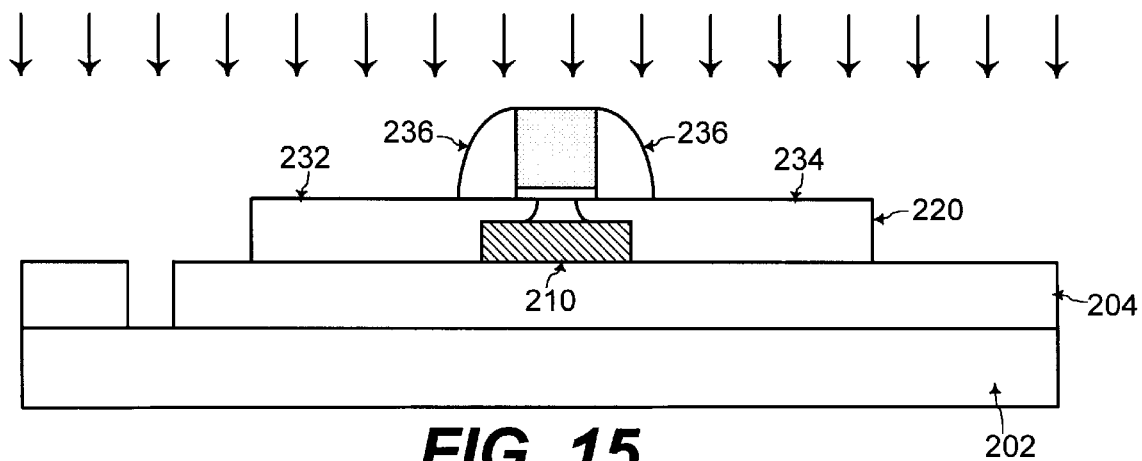
Figure 16:
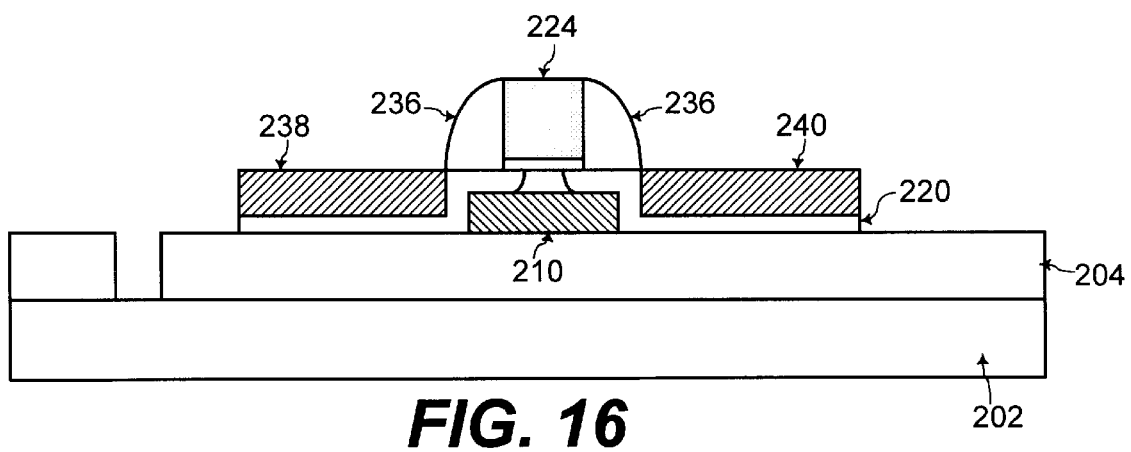

Referring to FIG. 15, after formation of the spacers 236, the drain and source dopant is implanted again to further dope the drain and source contact junctions 232 and 234, according to one embodiment of the present invention, if a higher concentration of the drain and source dopant is desired for the drain and source contact junctions 232 and 234. Processes for implanting the drain and source dopant are known to one of ordinary skill in the art of integrated circuit fabrication. The present invention may be practiced with or without the additional implantation of the drain and source dopant after formation of the spacers 236. Referring to FIG. 16, a drain silicide 238 is formed with the drain contact junction 232, and a source silicide 240 is formed with the source contact junction 234. Such silicides 238 and 240 may be comprised of one of cobalt silicide ($CoSi_2$) or titanium silicide ($TiSi_2$) for example, and processes for formation of such silicides are known to one of ordinary skill in the art of integrated circuit fabrication.

In this manner, the drain and source extension junctions 226 and 228 are formed on the thinner portion of the semiconductor material 220 disposed on the dielectric island 210 to minimize short channel effects of the MOSFET and such that the channel region of the MOSFET is fully depleted during operation of the MOSFET. On the other hand, the drain and source suicides 238 and 240 are formed with the thicker portion of the semiconductor material 220 disposed to the sides of the dielectric island 210. With thicker drain and source silicides 238 and 240, parasitic resistance at the drain and source of the MOSFET is minimized to enhance speed performance of the MOSFET.

The foregoing is by way of example only and is not intended to be limiting. For example, any specified material or any specified dimension of any structure described herein is by way of example only. In addition, as will be understood by those skilled in the art, the structures described herein may be made or used in the same way regardless of their position and orientation. Accordingly, it is to be understood that terms and phrases such as "over," "side," and "on" as used herein refer to relative location and orientation of various portions of the structures with respect to one another, and are not intended to suggest that any particular absolute orientation with respect to external objects is necessary or required.

The present invention is limited only as defined in the following claims and equivalents thereof.

I claim:

1. A method for fabricating a field effect transistor on a buried insulating material in SOI (semiconductor on insulator) technology, the method including the steps of:
   A. depositing a layer of dielectric material on said buried insulating material;
   B. patterning said layer of dielectric material to form a dielectric island having a top surface and having a height of a thickness of said layer of dielectric material;
   C. forming an opening through said buried insulating material at a location away from said dielectric island;
   D. depositing an amorphous semiconductor material to fill said opening through said buried insulating material and to surround said dielectric island;
   E. polishing said amorphous semiconductor material until said top surface of said dielectric island is exposed and such that said amorphous semiconductor material surrounds said dielectric island;
   F. depositing a layer of said amorphous semiconductor material on top of said dielectric island and on top of said amorphous semiconductor material surrounding said dielectric island;
   G. recrystallizing said amorphous semiconductor material surrounding said dielectric island and said layer of said amorphous semiconductor material to form a substantially single crystal structure of semiconductor material;
   wherein said semiconductor material disposed on said dielectric island has a thickness that is less than that of said semiconductor material that extends above said height of said dielectric island to the sides of said dielectric island;
   H. forming a gate dielectric and a gate electrode of said field effect transistor on top of a thinner portion of said semiconductor material disposed on said dielectric island;
   I. forming a drain extension region and a source extension region by implanting a drain and source dopant into exposed regions of said thinner portion of said semiconductor material disposed on said dielectric island;
   wherein a channel region of said field effect transistor is formed by said thinner portion of said semiconductor material disposed on said dielectric island between said drain and source extension regions; and
   J. forming a drain contact region and a source contact region from a thicker portion of said semiconductor material disposed to the sides of said dielectric island.

2. The method of claim 1, further including the steps of:
   forming spacers comprised of silicon dioxide ($SiO_2$) on sidewalls of said gate dielectric and said gate electrode; and
   forming a drain silicide with said drain contact region and forming a source silicide with said source contact region.

3. The method of claim 1, further including the step of:
   patterning said semiconductor material to etch away said semiconductor material within said opening.

4. The method of claim 1, wherein said buried insulating material is comprised of silicon dioxide ($SiO_2$) formed on a silicon substrate, and wherein said dielectric island is comprised of silicon nitride ($Si_3N_4$) having said height in a range of from about 300 angstroms to about 500 angstroms, and wherein said dielectric island has a width of from about 100 angstroms to about 300 angstroms.

5. The method of claim 1, wherein said amorphous semiconductor material deposited in said step D is comprised of amorphous silicon having a thickness in a range of from about 1000 angstroms to about 2000 angstroms deposited in a LPCVD (low pressure chemical vapor deposition) process using a temperature of less than about 550° Celsius.

6. The method of claim 5, wherein said layer of said amorphous semiconductor material deposited in said step F is comprised of amorphous silicon having a thickness in a range of from about 50 angstroms to about 500 angstroms deposited in a LPCVD (low pressure chemical vapor deposition) process using a temperature of less than about 550° Celsius.

7. The method of claim 6, wherein a thermal anneal is performed in said step G at a temperature of from about 600° Celsius to about 650° Celsius to recrystallize said amorphous silicon.

8. The method of claim 7, wherein said buried insulating material is formed on a semiconductor substrate comprised of silicon, and wherein said opening through said buried insulating material has a bottom wall of said silicon substrate, and wherein said silicon substrate at said bottom wall of said opening acts as a seed during said recrystallization of said amorphous silicon in said step G.

9. The method of claim 1, wherein said gate dielectric is comprised of a dielectric material having a dielectric constant that is higher than that of silicon dioxide ($SiO_2$), and wherein said gate electrode is comprised of polysilicon.

10. The method of claim 1, wherein said source and drain dopant is comprised of an N-type dopant for fabrication of an NMOSFET (N-channel Metal Oxide Semiconductor Field Effect Transistor).

11. The method of claim 1, wherein said drain and source dopant is comprised of a P-type dopant for fabrication of a PMOSFET (P-channel Metal Oxide Semiconductor Field Effect Transistor).

12. A method for fabricating a MOSFET (metal oxide semiconductor field effect transistor) on a buried insulating material comprised of silicon dioxide ($SiO_2$) formed on a silicon substrate in SOI (semiconductor on insulator) technology, the method including the steps of:

A. depositing a layer of dielectric material on said buried insulating material;

B. patterning said layer of dielectric material to form a dielectric island having a top surface and having a height of a thickness of said layer of dielectric material;

wherein said dielectric island is comprised of silicon nitride ($Si_3N_4$) having said height in a range of from about 300 angstroms to about 500 angstroms, and wherein said dielectric island has a width of from about 100 angstroms to about 300 angstroms;

C. forming an opening through said buried insulating material at a location away from said dielectric island;

D. depositing an amorphous semiconductor material to fill said opening through said buried insulating material and to surround said dielectric island;

wherein said amorphous semiconductor material is comprised of amorphous silicon having a thickness in a range of from about 1000 angstroms to about 2000 angstroms deposited in a LPCVD (low pressure chemical vapor deposition) process using a temperature of less than about 550° Celsius;

E. polishing said amorphous semiconductor material until said top surface of said dielectric island is exposed and such that said amorphous semiconductor material surrounds said dielectric island;

F. depositing a layer of said amorphous semiconductor material on top of said dielectric island and on top of said amorphous semiconductor material surrounding said dielectric island;

wherein said layer of said amorphous semiconductor material is comprised of amorphous silicon having a thickness in a range of from about 50 angstroms to about 500 angstroms deposited in a LPCVD (low pressure chemical vapor deposition) process using a temperature of less than about 550° Celsius;

G. recrystallizing said amorphous semiconductor material surrounding said dielectric island and said layer of said amorphous semiconductor material by performing a thermal anneal at a temperature of from about 600° Celsius to about 650° Celsius to form a substantially single crystal structure of semiconductor material;

wherein said opening through said buried insulating material has a bottom wall of said silicon substrate, and wherein said silicon substrate at said bottom wall of said opening acts as a seed during said recrystallization of said amorphous silicon;

and wherein said semiconductor material disposed on said dielectric island has a thickness that is less than that of said semiconductor material that extends above said height of said dielectric island to the sides of said dielectric island;

H. forming a gate dielectric and a gate electrode of said field effect transistor on top of a thinner portion of said semiconductor material disposed on said dielectric island;

wherein said gate dielectric is comprised of a dielectric material having a dielectric constant that his higher than that of silicon dioxide ($SiO_2$), and wherein said gate electrode is comprised of polysilicon;

I. forming a drain extension region and a source extension region by implanting a drain and source dopant into exposed regions of said thinner portion of said semiconductor material disposed on said dielectric island;

wherein said source and drain dopant is comprised of an N-type dopant for fabrication of an NMOSFET (N-channel Metal Oxide Semiconductor Field Effect Transistor);

and wherein said drain and source dopant is comprised of a P-type dopant for fabrication of a PMOSFET (P-channel Metal Oxide Semiconductor Field Effect Transistor);

and wherein a channel region of said field effect transistor is formed by said thinner portion of said semiconductor material disposed on said dielectric island between said drain and source extension regions;

J. forming a drain contact region and a source contact region from a thicker portion of said semiconductor material disposed to the sides of said dielectric island;

K. forming spacers comprised of silicon dioxide ($SiO_2$) on sidewalls of said gate dielectric and said gate electrode; and L. forming a drain silicide with said drain contact region and a source silicide with said source contact region.

13. A field effect transistor formed on a buried insulating material in SOI (semiconductor on insulator) technology, the field effect transistor comprising:

a dielectric island, comprised of a dielectric material and having a height, formed on said buried insulating material;

a semiconductor material surrounding said dielectric island;

a layer of said semiconductor material deposited on top of said dielectric island and on top of said semiconductor material surrounding said dielectric island;

wherein said semiconductor material disposed on said dielectric island has a thickness that is less than that of said semiconductor material that extends above said height of said dielectric island to the sides of said dielectric island;

a gate dielectric and a gate electrode of said field effect transistor formed on top of a thinner portion of said layer of semiconductor material disposed on said dielectric island;

a drain extension region and a source extension region formed by implanting a drain and source dopant into exposed regions of said thinner portion of said layer of semiconductor material disposed on said dielectric island;

a channel region of said field effect transistor formed by said thinner portion of said semiconductor material disposed on said dielectric island between said drain and source extension regions; and a drain contact region and a source contact region formed from a thicker portion of said semiconductor material disposed to the sides of said dielectric island.

14. The field effect transistor of claim 13, further comprising:

spacers comprised of silicon dioxide (SiO$_2$) formed on sidewalls of said gate dielectric and said gate electrode; and a drain silicide formed with said drain contact region and a source silicide formed with said source contact region.

15. The field effect transistor of claim 13, wherein said buried insulating material is comprised of silicon dioxide (SiO$_2$) formed on a silicon substrate, and wherein said dielectric island is comprised of silicon nitride (Si$_3$N$_4$) having said height in a range of from about 300 angstroms to about 500 angstroms, and wherein said dielectric island has a width of from about 100 angstroms to about 300 angstroms.

16. The field effect transistor of claim 13, wherein said gate dielectric is comprised of a dielectric material having a dielectric constant that his higher than that of silicon dioxide (SiO$_2$), and wherein said gate electrode is comprised of polysilicon.

17. The field effect transistor of claim 13, wherein said source and drain dopant is comprised of an N-type dopant for fabrication of an NMOSFET (N-channel Metal Oxide Semiconductor Field Effect Transistor).

18. The field effect transistor of claim 13, wherein said drain and source dopant is comprised of a P-type dopant for fabrication of a PMOSFET (P-channel Metal Oxide Semiconductor Field Effect Transistor).

* * * * *